(12) United States Patent
Tarico et al.

(10) Patent No.: US 9,236,514 B1
(45) Date of Patent: Jan. 12, 2016

(54) SOLAR PANEL RISER ASSEMBLY AND WEIGHT BALANCED SOLAR PANEL ARRAY USING SAME

(71) Applicants: Daniel J. Tarico, Phoenix, AZ (US); James Kenneth Smith, Phoenix, AZ (US); Michael H. Yount, Gilbert, AZ (US); Michael Kremer, Gilbert, AZ (US)

(72) Inventors: Daniel J. Tarico, Phoenix, AZ (US); James Kenneth Smith, Phoenix, AZ (US); Michael H. Yount, Gilbert, AZ (US); Michael Kremer, Gilbert, AZ (US)

(73) Assignee: ViaSol Energy Solutions, Tempe, AZ (US)

( * ) Notice: Subject to any disclaimer, the term of this patent is extended or adjusted under 35 U.S.C. 154(b) by 125 days.

(21) Appl. No.: 14/059,394

(22) Filed: Oct. 21, 2013

(51) Int. Cl.
*F24J 2/52* (2006.01)
*H01L 31/052* (2014.01)

(52) U.S. Cl.
CPC .................... *H01L 31/052* (2013.01)

(58) Field of Classification Search
CPC ......... H02S 30/00; H02S 30/10; H02S 30/20; H02S 30/30; H02S 30/32; H02S 20/00; H02S 20/10; H02S 20/30; H02S 20/32; H01L 31/042; F24J 2/38; F24J 2/52; F24J 2/54; F24J 2/523; F24J 2/5201; F24J 2/5417; F24J 2/5252
USPC ............... 136/244, 246; 248/185.1; 52/173.1, 52/173.3; 244/168, 173, 172.7, 172.8; 126/569
See application file for complete search history.

(56) References Cited

U.S. PATENT DOCUMENTS

| | | | |
|---|---|---|---|
| 4,226,502 A | 10/1980 | Gunzler | |
| 4,508,426 A * | 4/1985 | Hutchison | 359/852 |
| 7,531,741 B1 | 5/2009 | Melton et al. | |
| 7,554,030 B2 | 6/2009 | Shingleton | |
| 8,407,950 B2 | 4/2013 | Hartelius | |
| 2003/0000564 A1 | 1/2003 | Shingleton et al. | |
| 2006/0044511 A1 | 3/2006 | Mackamul | |
| 2008/0308091 A1 | 12/2008 | Corio | |
| 2009/0188487 A1 | 7/2009 | Jones et al. | |
| 2010/0185333 A1 | 7/2010 | Oosting | |
| 2010/0258110 A1 | 10/2010 | Krabbe et al. | |
| 2011/0061644 A1 | 3/2011 | Pizzarello et al. | |
| 2011/0079214 A1 | 4/2011 | Hon | |
| 2011/0186040 A1 | 8/2011 | Liao | |
| 2012/0240974 A1 | 9/2012 | Lee et al. | |
| 2012/0279486 A1 | 11/2012 | Sakai | |
| 2013/0019921 A1 * | 1/2013 | Au | 136/246 |
| 2013/0037082 A1 | 2/2013 | Grant | |
| 2013/0192659 A1 | 8/2013 | Upton | |
| 2013/0269753 A1 * | 10/2013 | Corio | 136/246 |

* cited by examiner

*Primary Examiner* — Jeffrey T Barton
*Assistant Examiner* — Daniel Malley, Jr.
(74) *Attorney, Agent, or Firm* — Invention To Patent Services; Alex Hobson

(57) ABSTRACT

A solar module riser assembly that is configured to allow a solar module attached thereto to fall-to-flat when not being forced into an angular position is provided. A riser assembly includes a riser support and a tube support attached to the riser support. A torque tube may extend across a plurality of riser assemblies and be retained by tube supports attached to each of the riser assemblies. A torque tube support is configured to rotate about the riser support and thereby position a solar module coupled thereto at an optimum angular orientation for solar exposure and track the sun. A first riser and second riser may be configured on opposing sides of a central drive device and lever arms attached to link bars drive tube supports when the link bar is moved. The first and second riser may be configured to create equal and opposite force on the link bar.

18 Claims, 13 Drawing Sheets

SOLAR PANEL RISER ASSEMBLY AND WEIGHT BALANCED SOLAR PANEL ARRAY USING SAME

BACKGROUND OF THE INVENTION

1. Field of the Invention

The present invention relates to a solar module riser assembly that is configured to allow a solar module attached thereto to fall-to-flat when not being forced into an angled position and solar module arrays utilizing said riser assembly.

2. Background

Many solar modules are configured with a rotational axis that is below the solar module array and the modules rotate back and forth over a vertical pane extending through the rotational axis. With this type of configuration, the modules can fall to one side if not continuously supported and this fall can damage the modules and the array. In addition, large motors and support members are required to retain the array in position over the rotational axis. Furthermore, oscillation of the system can be difficult to manage as the modules may be forced or oscillate from one side to the other side of the rotational axis.

SUMMARY OF THE INVENTION

The invention is directed to a solar module riser assembly that is configured to allow a solar module attached thereto to fall-to-flat when not being forced into a rotational position and solar module arrays utilizing said riser assembly. A riser assembly comprises a riser support and a tube support attached to the riser support. A tube support is configured for retaining and supporting a torque tube. A torque tube may extend across a plurality of riser assemblies and be retained by tube supports attached to each of the riser assemblies. One or more solar modules may be coupled to a torque tube. A torque tube support is configured to rotate about the riser support and thereby position a solar module coupled thereto at an optimum angular orientation for solar exposure. A tube support is coupled to a riser support by a bearing that allows the tube support to rotate. In an exemplary embodiment, a tube support is configured with a center of mass that is below, or to one side of the rotational axis of the tube support, or to one side the riser bearing. This configuration causes the tube support to "fall-to-flat", when not being forced into an angular position. The weight of the tube support and location of the riser bearing causes the tube support to rotate under its own weight into a fall-to-flat orientation. A tube support has a resting position, or "flat" position, that may be configured to correspond with a flat orientation of a solar module coupled thereto, by way of a torque tube, being in a substantially flat orientation. A substantially flat orientation of a solar module is an orientation having the solar collection surface of the solar modules horizontal or no more than five degrees from level/horizontal. A tube support may be configured such that when a torque tube is attached thereto, it will fall-to-flat. A tube support may be configured such that a torque tube is retained on one side of the rotational axis and therefore, unless the tube support is being forced into an angular position, the weight of the torque tube retained by the tube support will cause the tube support to fall-to-flat.

A tube support may also comprise a lockout pin that prevents the tube support from rotating with respect to the riser support about the bearing. This lockout pin may be configured to lock the tube support in a substantially flat orientation. A plurality of lockout pin locations may be provided in any suitable rotational position of the tube support about the riser bearing however. A series of lockout holes may be configured in the riser support and/or tube support whereby a lockout pin may be inserted therethrough.

A tube support is configured to "face" one side of the riser support, or riser assembly. A tube support faces the side of the riser that a torque tube is coupled thereto. A tube support may have an extension having a free end and a fixed end attached to the tube support body. The free end of a tube support extension may extend to the side the tube support "faces".

A lever arm may be coupled to a tube support and/or a torque tube and force the tube support to rotate about the riser bearing. A lever arm may be coupled to a link bar and the link bar may force the lever arm to move and thereby force a tube support to rotate. A plurality of lever arms may be coupled to a single link bar. In an exemplary embodiment, a drive device is coupled to a link bar and is configured to more a link bar in a back and forth direction to cause solar modules to track the sun. In an exemplary embodiment, a drive device is configured to move a link bar in a first direction and in an opposing, second direction. The direction of motion of a link bar may be substantially perpendicular to the length axis of a torque tube, and/or rows of solar modules. A drive device may be a central drive device, wherein it is configured between a first and second riser assembly on opposing sides of the drive device.

In an exemplary embodiment, a drive device is configured centrally between a first riser assembly and a second riser assembly. Furthermore, a first riser assembly may be configured with a tube support facing a central dive device, and a second riser assembly, position on the opposing side of the central drive device, may be configured with a tube support facing the central dive device. Lever arms coupled to these two tube supports may be configured to exert opposing forces on a common link bar. This type of assembly provides for a substantially weight balanced solar array system and enables a lower output drive device to produce angular positioning, or solar tracking of solar module.

Levers arms may be coupled to a link bar in any suitable way. In an exemplary embodiment, a lever arm coupler enables a lever arm to slide along the length of a link bar and subsequently be secured in a desired location. A lever arm has a link bar end and a torque tube end. A lever arm may be attached to a link bar such that it extends at an offset angle to the riser or offset to a vertical orientation. Therefore, when the link bar moves in a direction that reduces or increases the offset angle, the tube support will be forced to rotate about the riser bearing and into an angular orientation or rotational position about the riser bearing. A solar module attached to a torque tube retained by the tube support will therefore, also be forced into an angular orientation. A lever arm may be attached with any suitable offset angle including, but not limited to, about five degrees or more, about ten degrees or more, about twenty degrees or more, about thirty degrees or more, about 40 degrees or more and any range between and including the offset angles provided. An offset angle is the angle between a vertical line drawn through the rotational axis of the tube support, or the center of the riser bearing in most cases, and the length axis of a lever arm.

A link bar end of a lever arm may be coupled to a link bar by a lever link coupler. A lever link coupler may be configured to slide along a link bar and then be secured in a desired location. A lever link coupler may comprise a pivot and/or bearing that enables the lever arm attached thereto to rotate about the lever pivot, or about a lever rotational axis, as described herein. Lever arm may be secured to a link bar at an offset distance, whereby when the offset distance is changed, the lever arm will cause the a tube support coupled thereto, by way of a torque tube in a preferred embodiment, to rotate about the riser bearing. An offset distance is the distance from the lever rotational axis to a vertical line drawn through the rotational axis of the tube support.

A link bar end of a lever arm may be configured proximate a drive device, or closer to the drive device than the torque tube end of the link bar; as measured horizontally to the drive device. Conversely, a link bar end of a lever arm may be coupled to a link bar distal a drive device, or further away from the drive device than the torque tube end; as measured horizontally to the drive device. A lever arm has an offset distance that is the difference is distance between the link bar end and the torque tube end from a drive device and may be a proximate offset distance, or distal offset distance. A proximate offset distance is a condition where the link bar end is configured closer to a drive device than the torque tube end and a distal offset distance is a configuration where the link bar end is configured further away from a drive device than the torque tube end.

In an exemplary embodiment, a solar module array comprises a central drive device configured to drive a link bar from a first side of said central drive device to a second side of said central drive device. A first riser is configured on a first side of said central drive device and a second riser is configured on a second side of said central drive device, wherein the first riser and the second riser are on opposing sides of said central drive device. The first riser is configured with a tube support facing the second riser, whereby the link bar coupled to the first and second risers is substantially weight balanced. A first lever arm coupled to the first riser may be configured with a distal offset distance that is substantially equal to a proximal offset distance of a second lever arm coupled to the second riser, thereby causing equal but opposite force on a common link bar coupled between the two lever arms. When substantially equal weight force is exerted on opposing lever arms, and the opposing lever arms are positioned with substantially the same offset distance and/or equal but opposite offset angles, the forces exerted on the link bar cancel each other creating a substantially weight balanced solar module array.

A first riser may be configured to the east side of a central drive device and the second riser may be configured on a west side of a central drive device. A torque tube may extend and be coupled with any suitable number of tube supports and riser assemblies including, but not limited to, one or more, two or more, five or more, ten or more, twenty or more and any range between and including the numbers provided. Any number of solar modules may be coupled to a torque tube including, but not limited to, one or more, five or more, ten or more, twenty or more and any range between and including the numbers provided.

A torque tube is a support that is configured to extend across a plurality of riser assemblies and may be segmented and assembled into a single continuous support. A torque tube does not necessarily have to be a tube but may be any suitable type of support that can extend from a tube support and can support solar modules. A torque tube may be a L channel, a T channel or any other suitable geometry.

The summary of the invention is provided as a general introduction to some of the embodiments of the invention, and is not intended to be limiting. Additional example embodiments including variations and alternative configurations of the invention are provided herein.

BRIEF DESCRIPTION OF THE DRAWINGS

The accompanying drawings are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
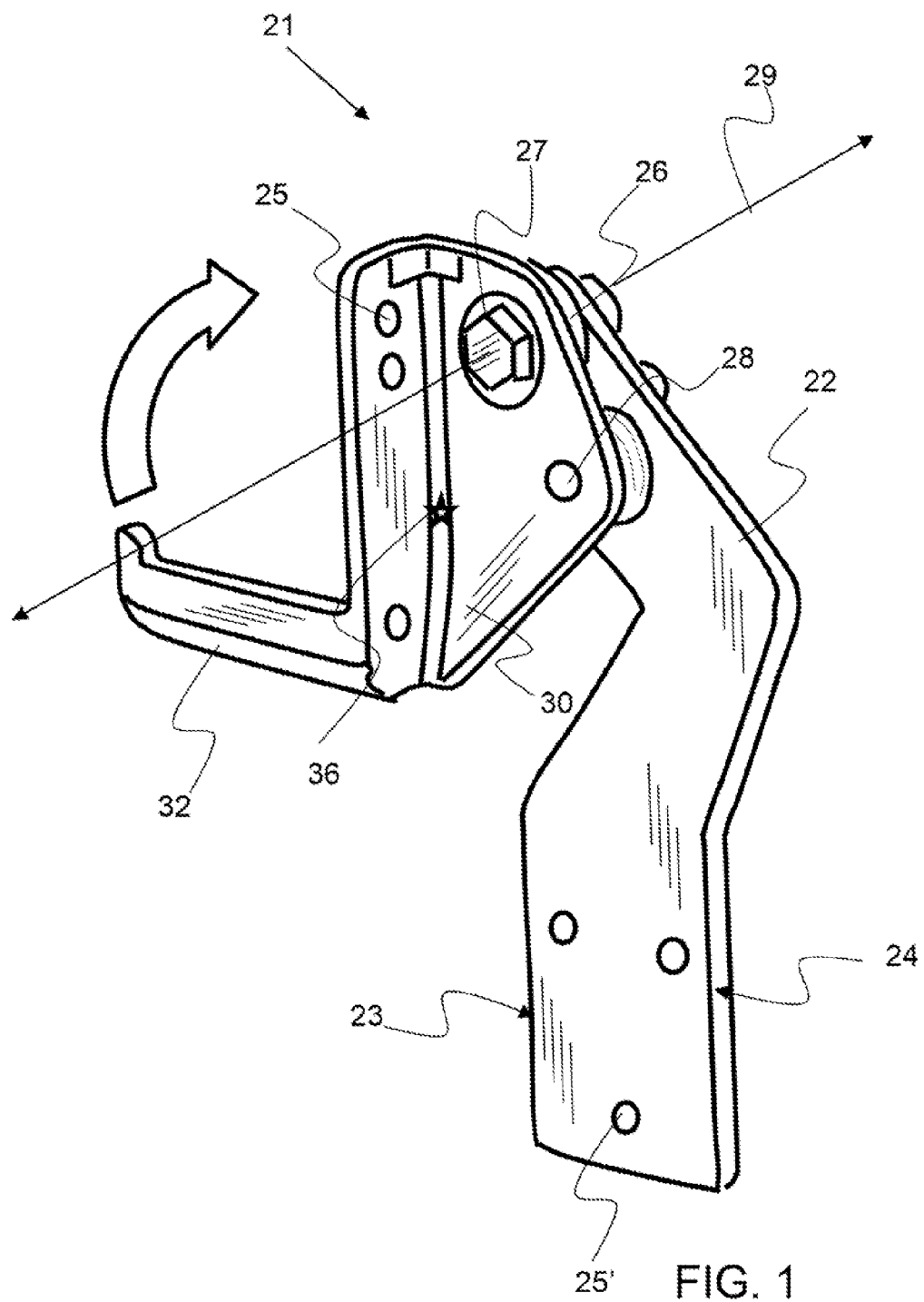

FIG. 1 shows an isometric view of an exemplary riser assembly comprising a riser support and a tube support.

Figure 2:
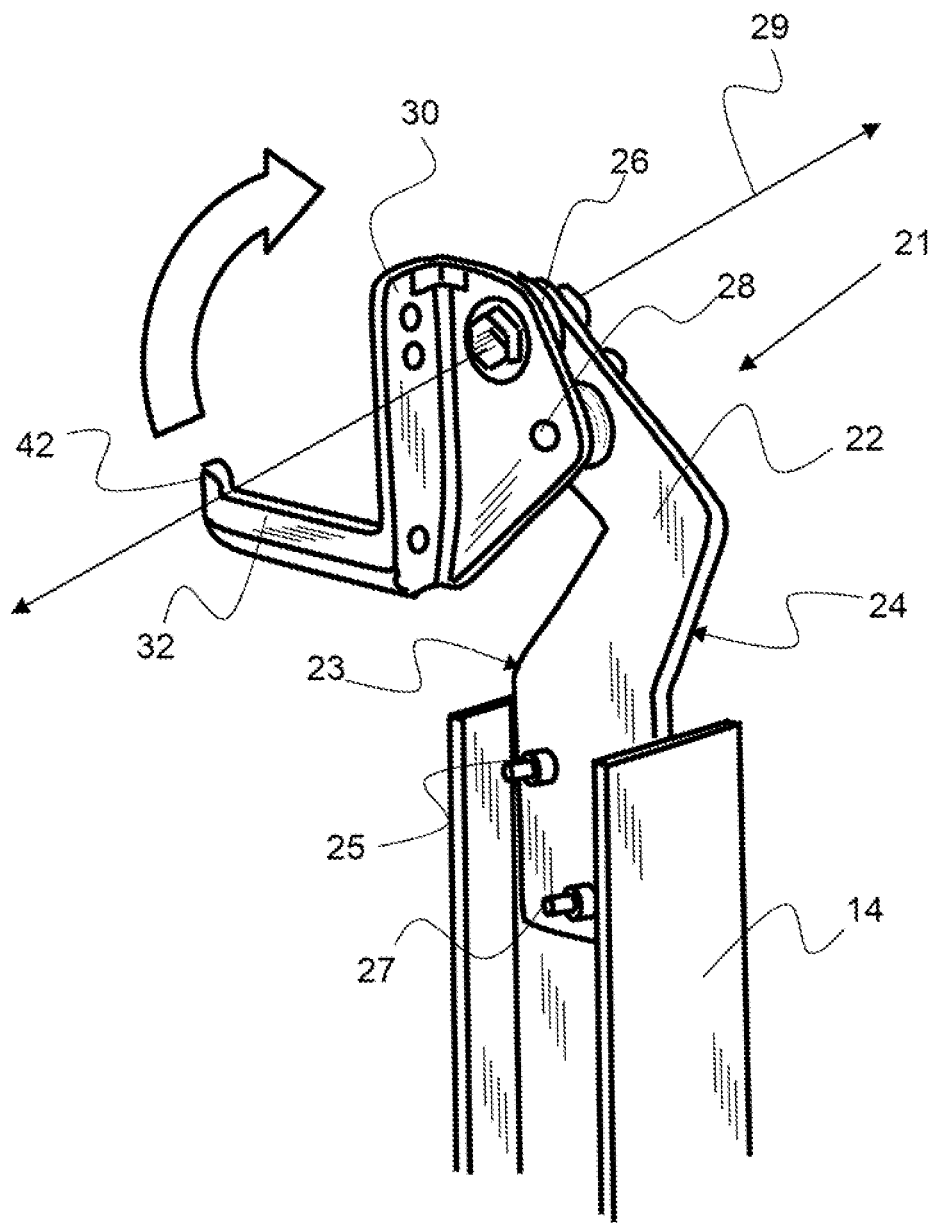

FIG. 2 shows an isometric view of an exemplary riser assembly attached to a structural support.

Figure 3:
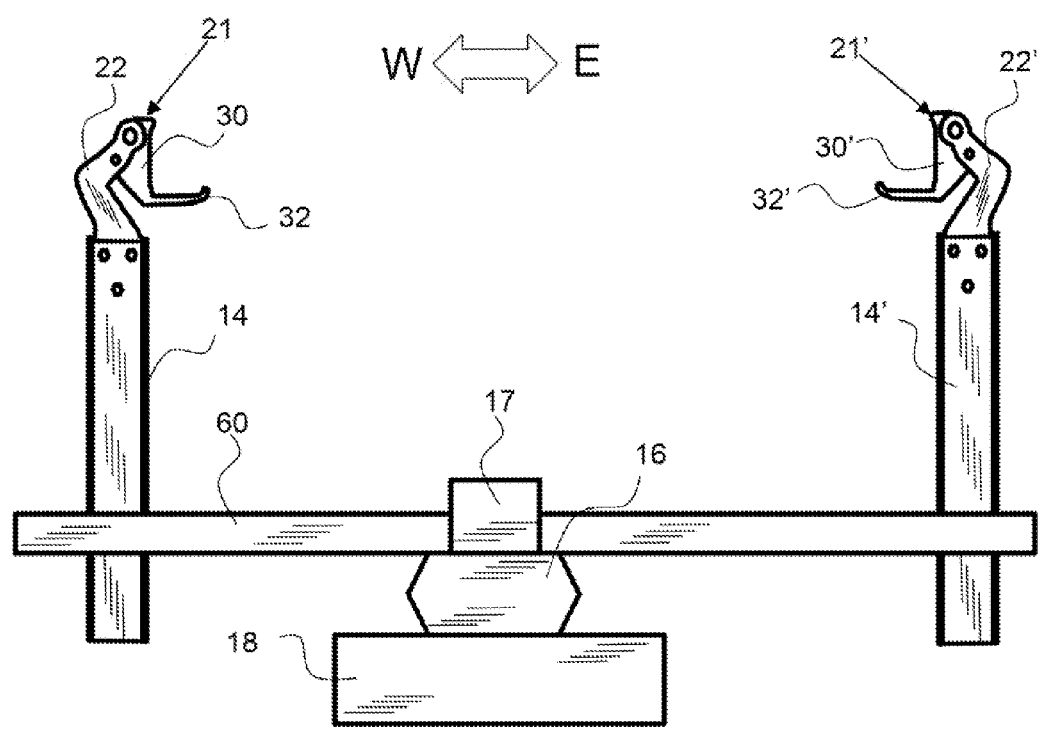

FIG. 3 shows a side view of two exemplary riser assemblies configured on opposing sides of a drive device.

Figure 4:
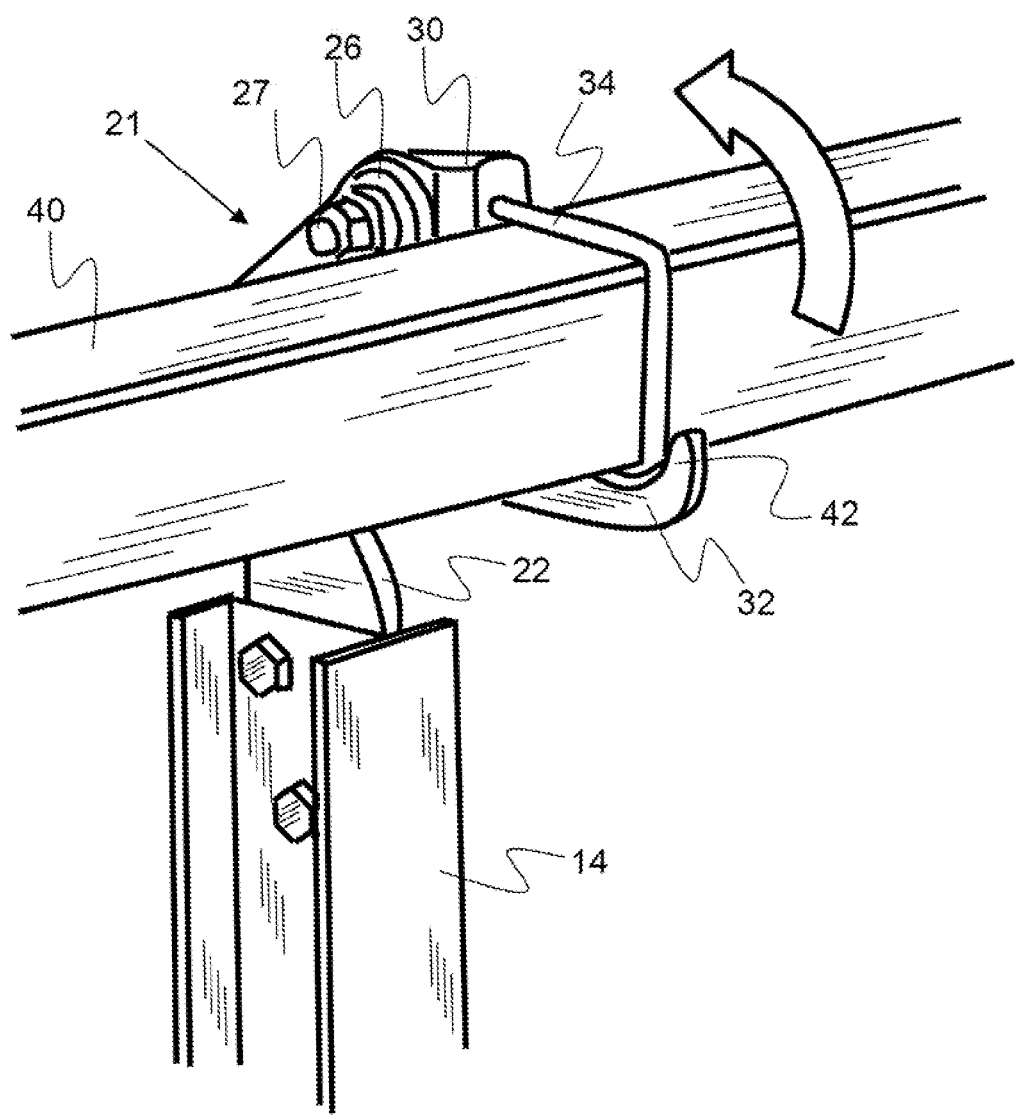

FIG. 4 shows an isometric view of an exemplary torque tube retained by a tube support.

Figure 5:
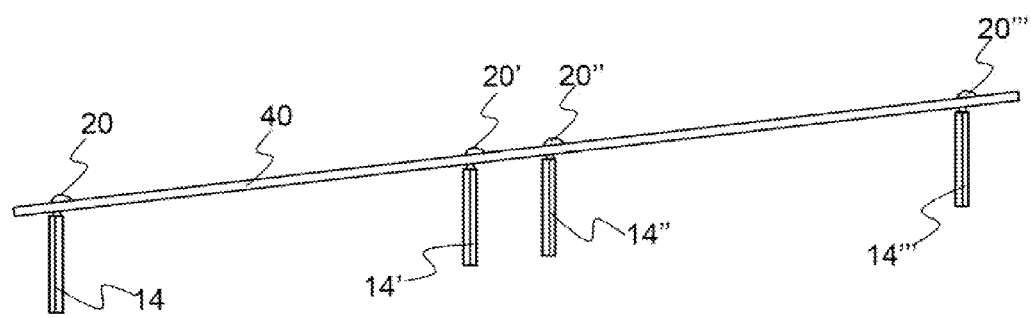

FIG. 5 shows an isometric view of an exemplary torque tube extending across, and being retained by a plurality of risers.

Figure 6:
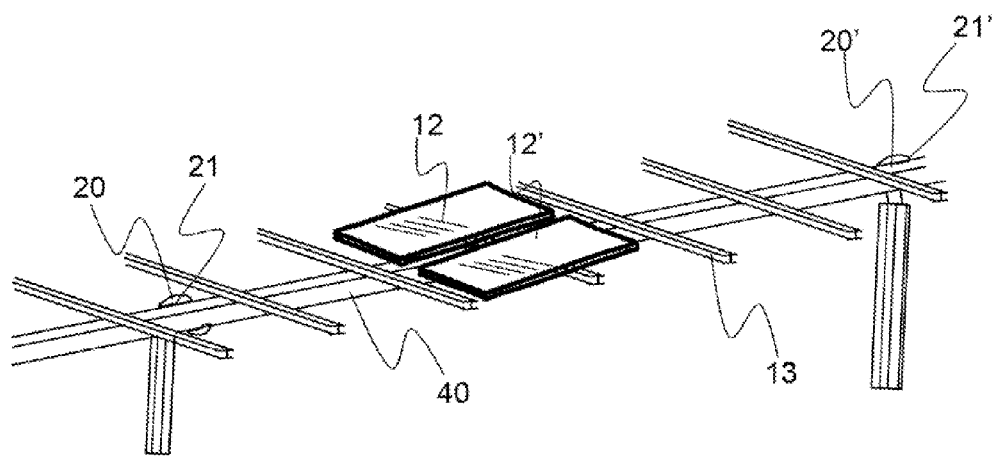

FIG. 6 shows an isometric view of an exemplary torque tube extending across and being retained by a plurality of riser assemblies and a pair of solar modules coupled thereto.

Figure 7:
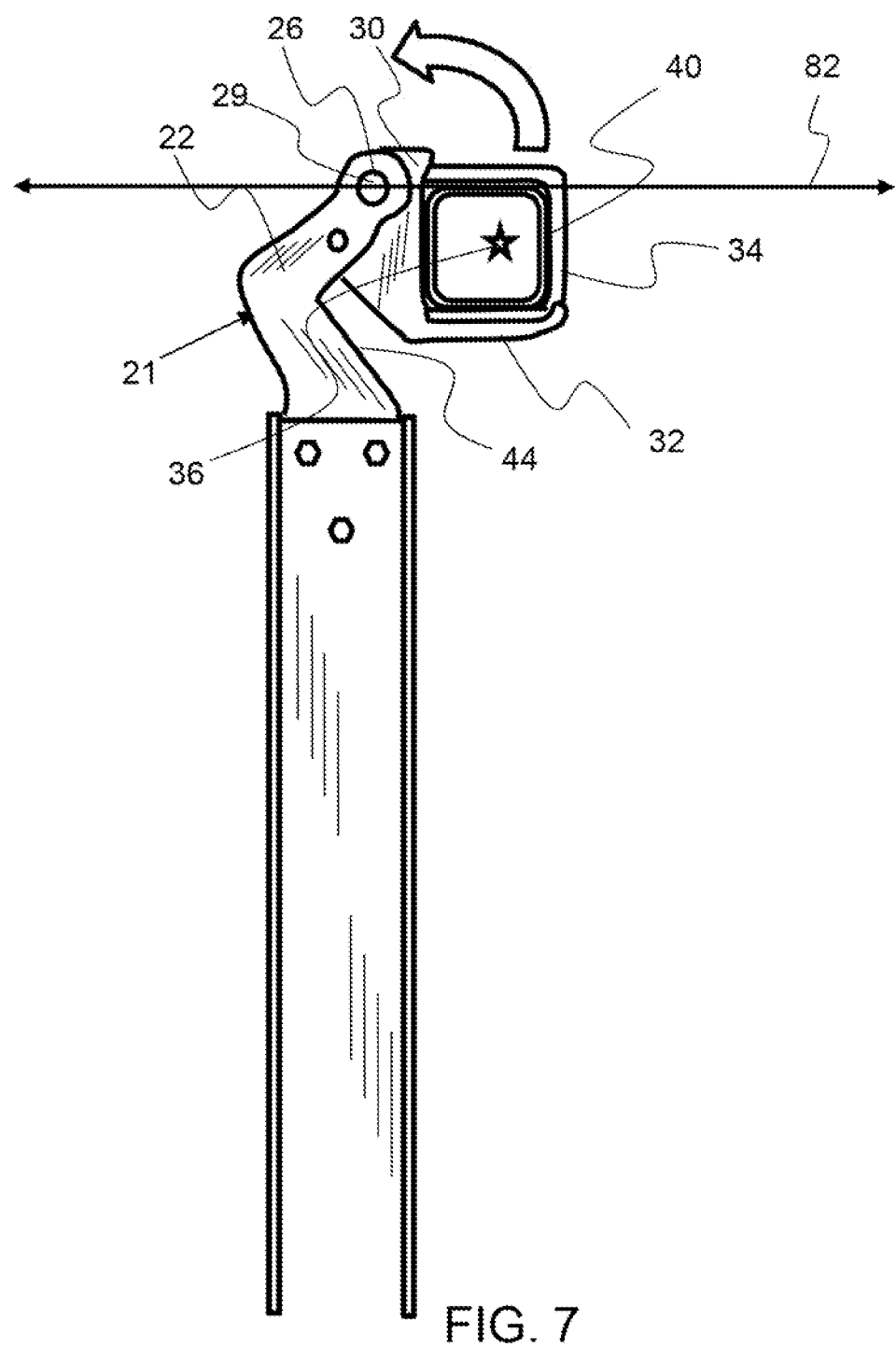

FIG. 7 shows a side cross sectional view of an exemplary riser assembly having a torque tube retained thereon.

Figure 8:
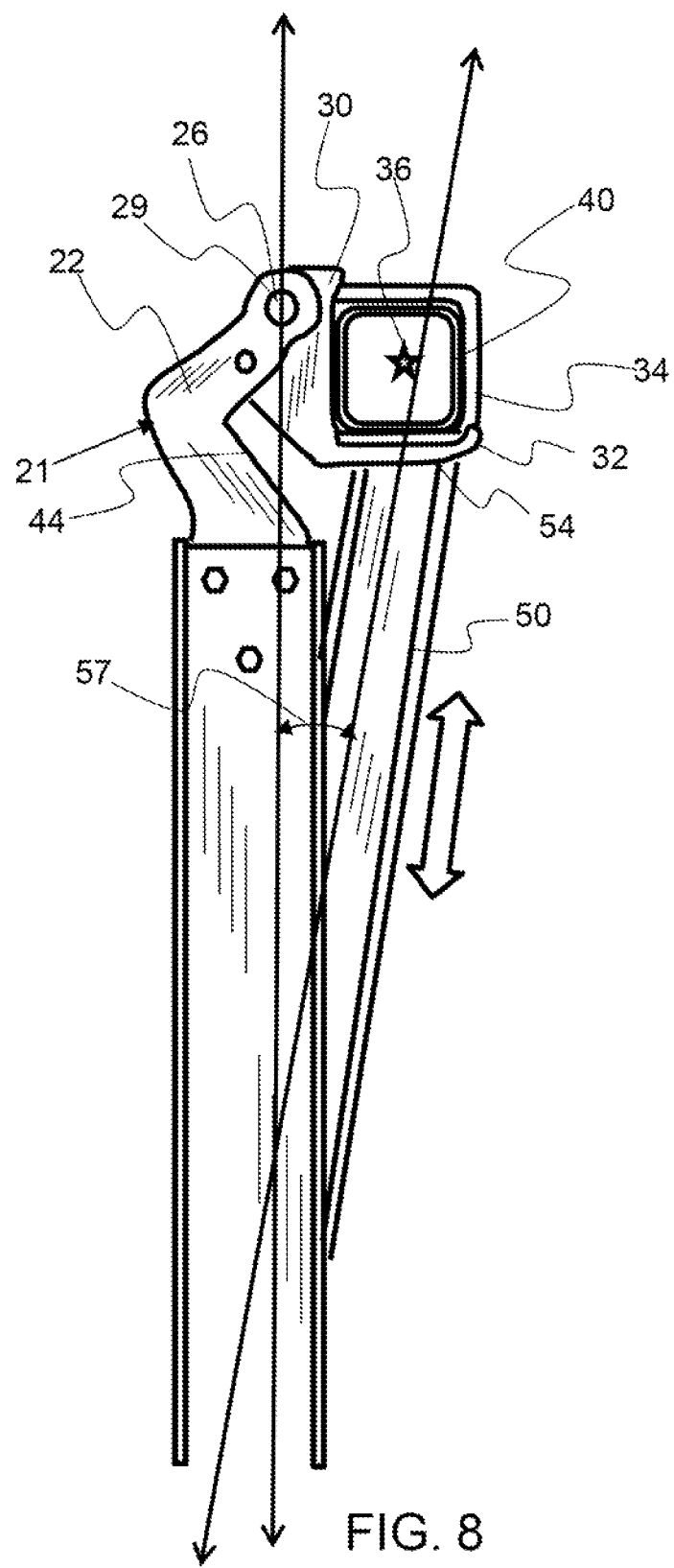

FIG. 8 shows a side cross sectional view of an exemplary riser assembly having a torque tube retained thereon and a lever arm attached to the torque tube.

Figure 9:
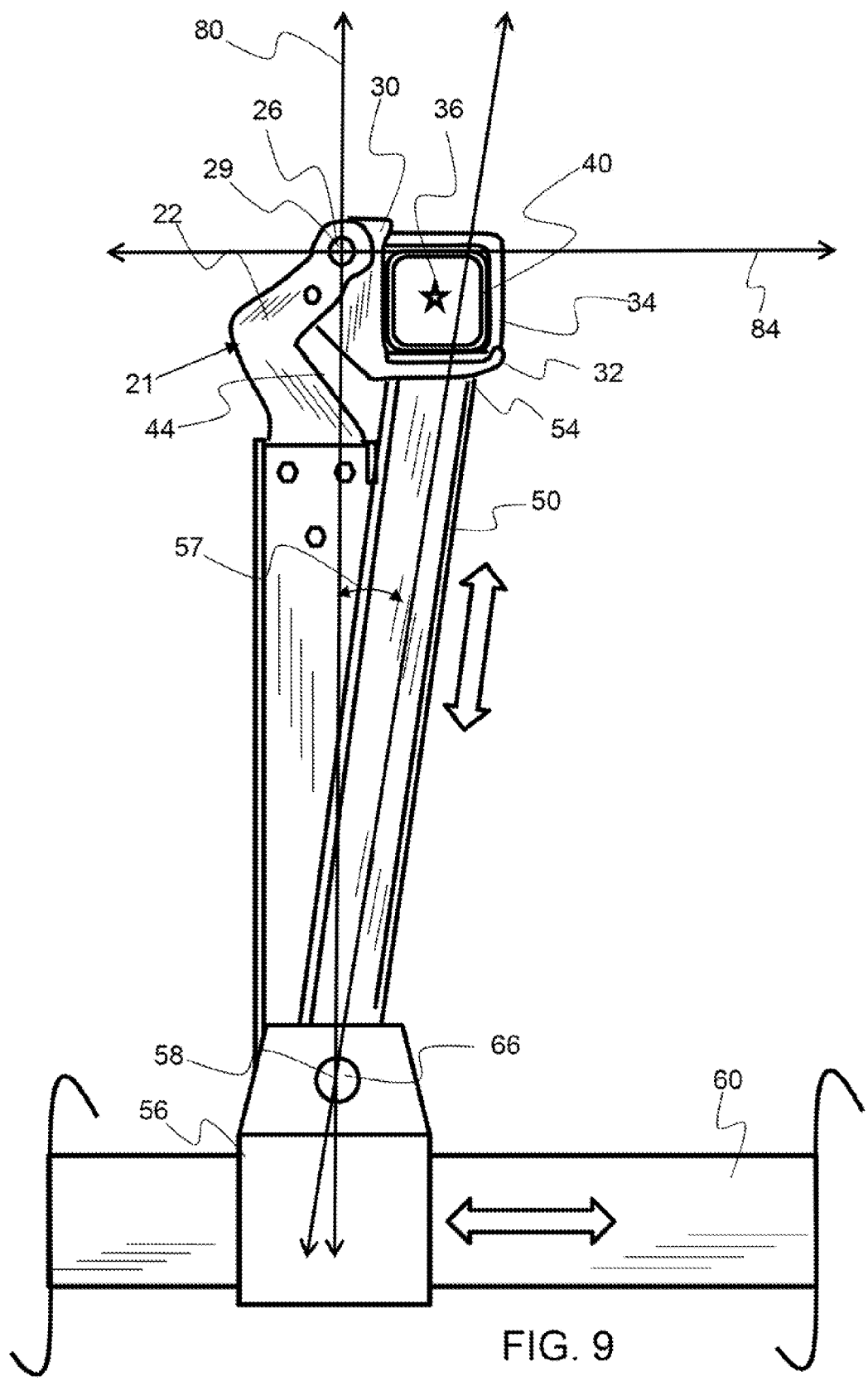

FIG. 9 shows a side cross sectional view of an exemplary riser assembly having a torque tube retained thereon and a lever arm attached to a lever link coupler.

Figure 10:
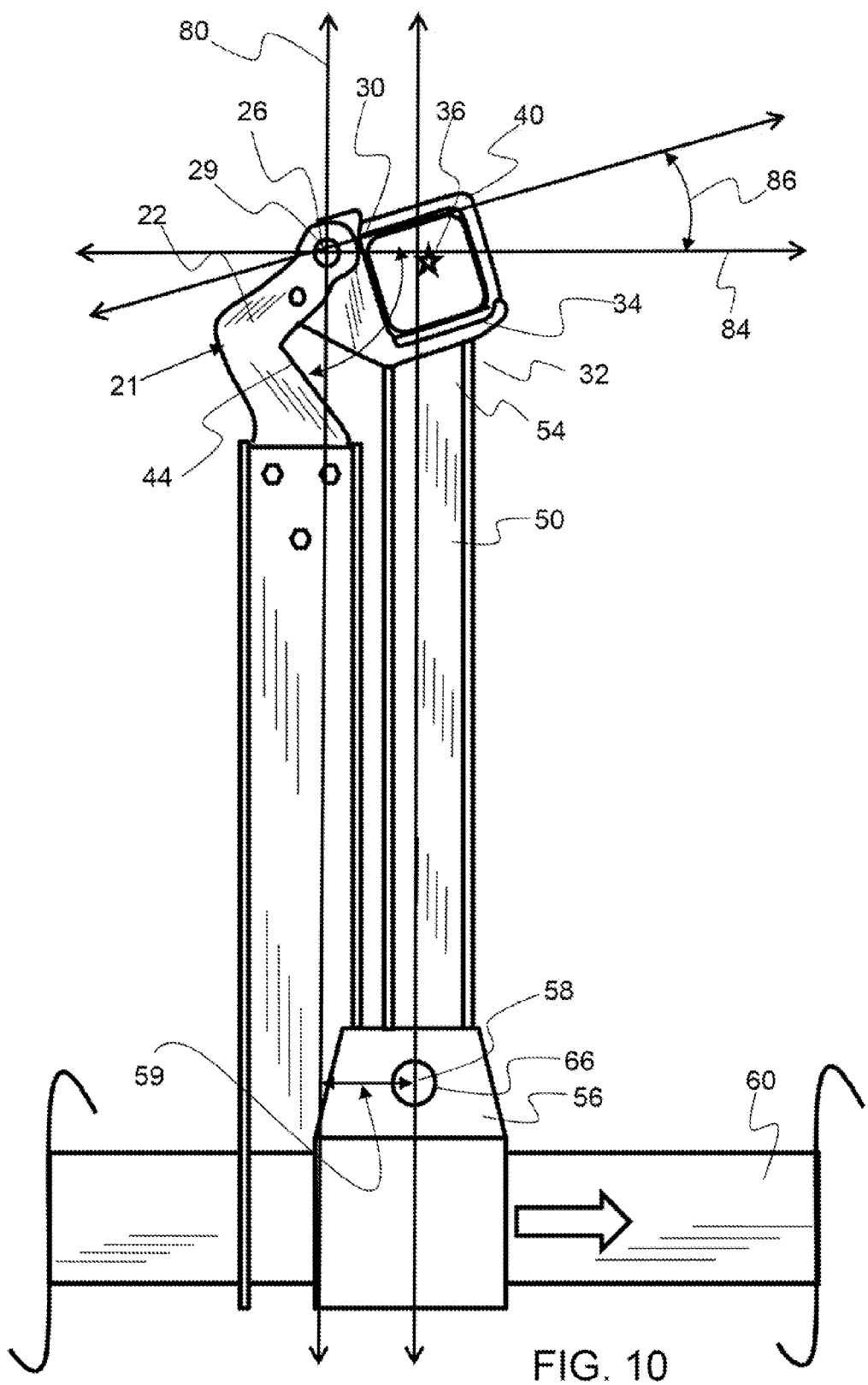

FIG. 10 shows a side cross sectional view of an exemplary riser assembly having a torque tube retained thereon and a lever arm attached to a lever link coupler.

Figure 11:
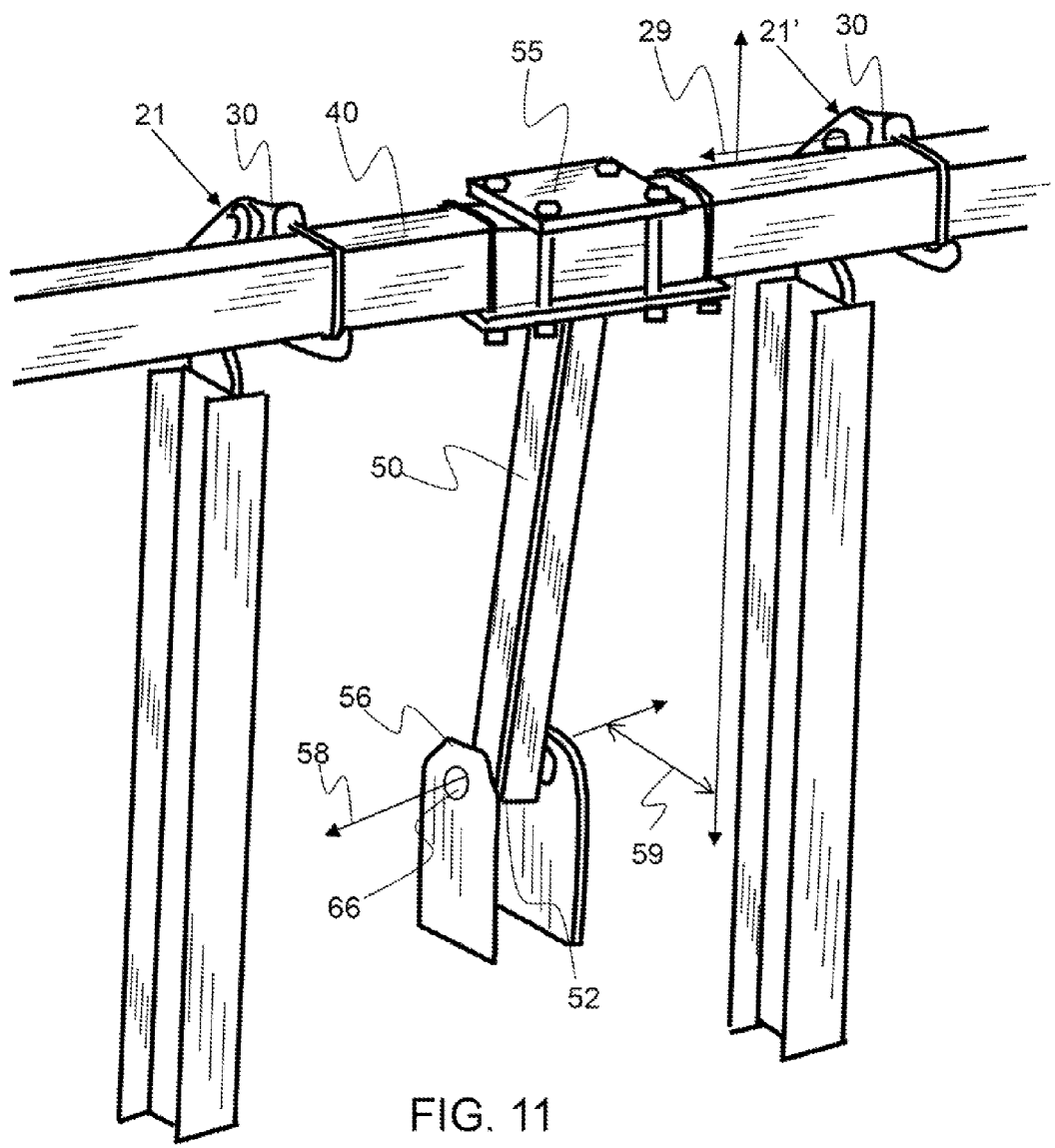

FIG. 11 shows an isometric view of two exemplary riser assemblies having a torque tube retained thereon and a lever arm attached to the torque tube.

Figure 12:
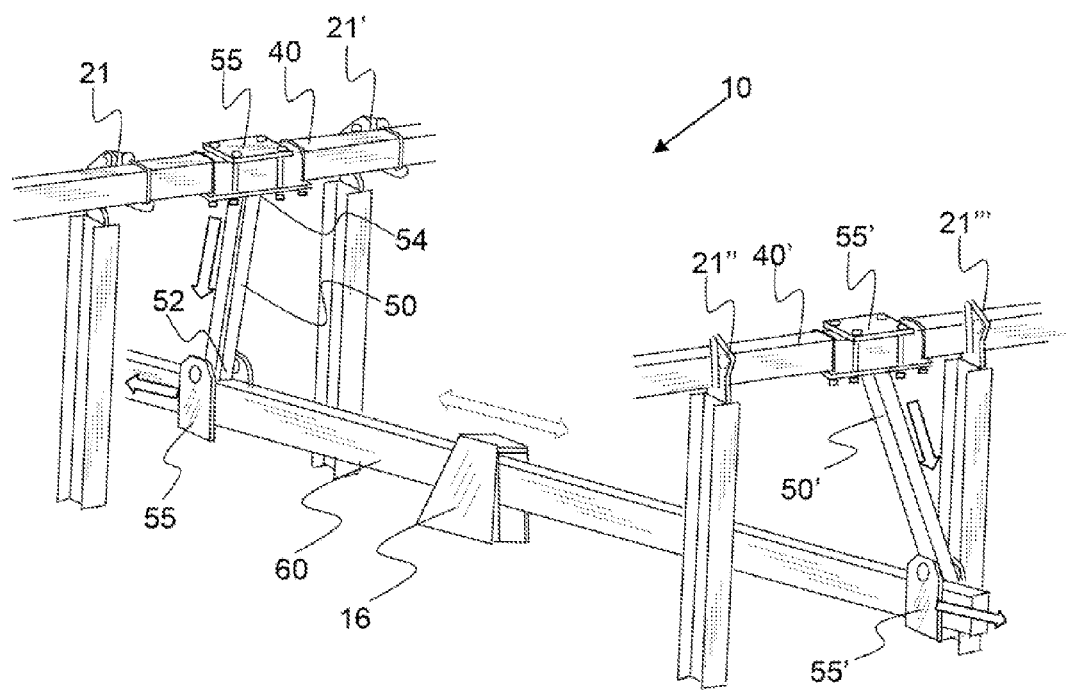

FIG. 12 shows an isometric view of two exemplary riser assemblies on a first side of a central drive device, two exemplary riser assemblies on a second on a second side of a central drive, and a link bar extending and coupled to lever arms.

Figure 13A:
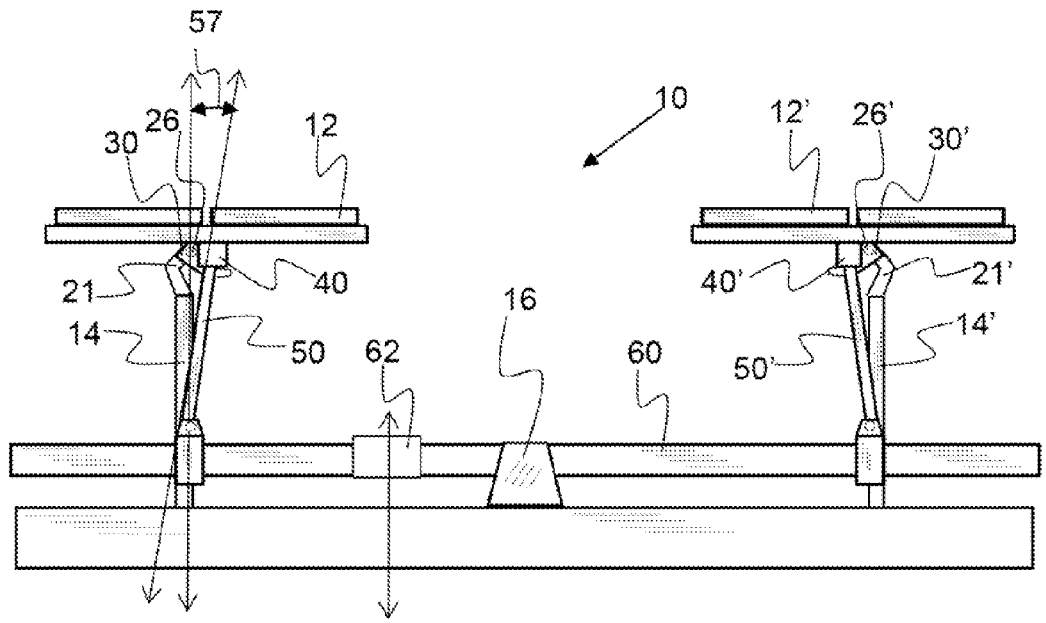

FIG. 13A shows a side view of an exemplary solar module array with a link bar in a first position and the solar modules in a substantially flat or horizontal orientation.

Figure 13B:
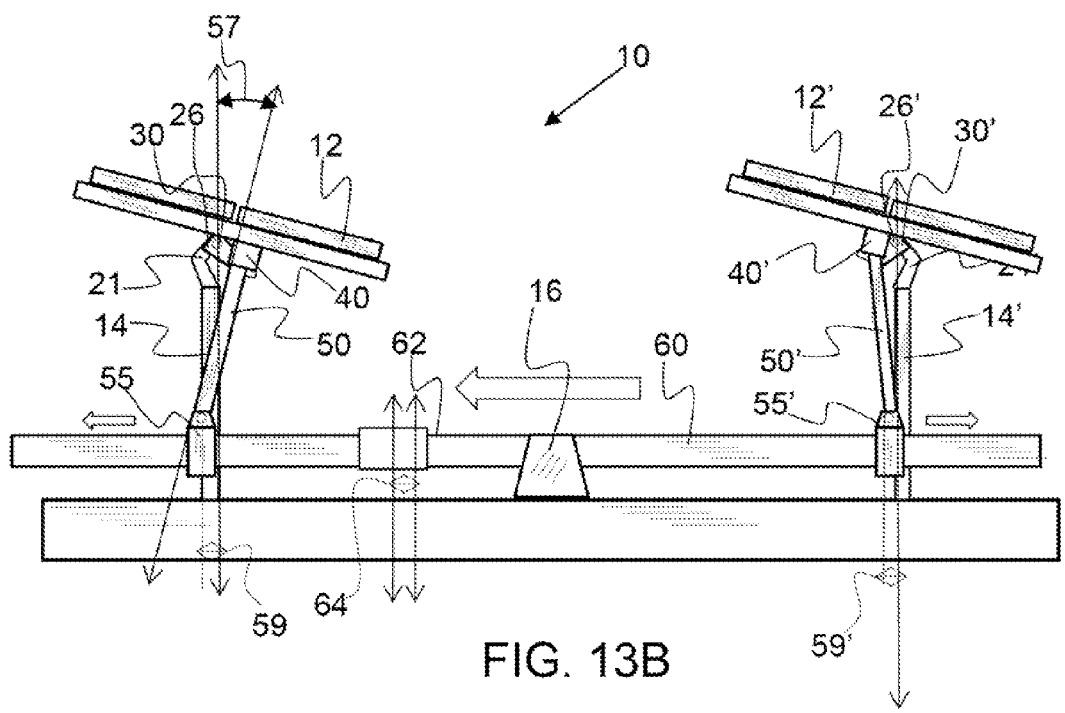

FIG. 13B shows a side view of the exemplary solar module array shown in FIG. 13A with the link bar in a second position and the solar modules in an angled orientation.

Figure 14:
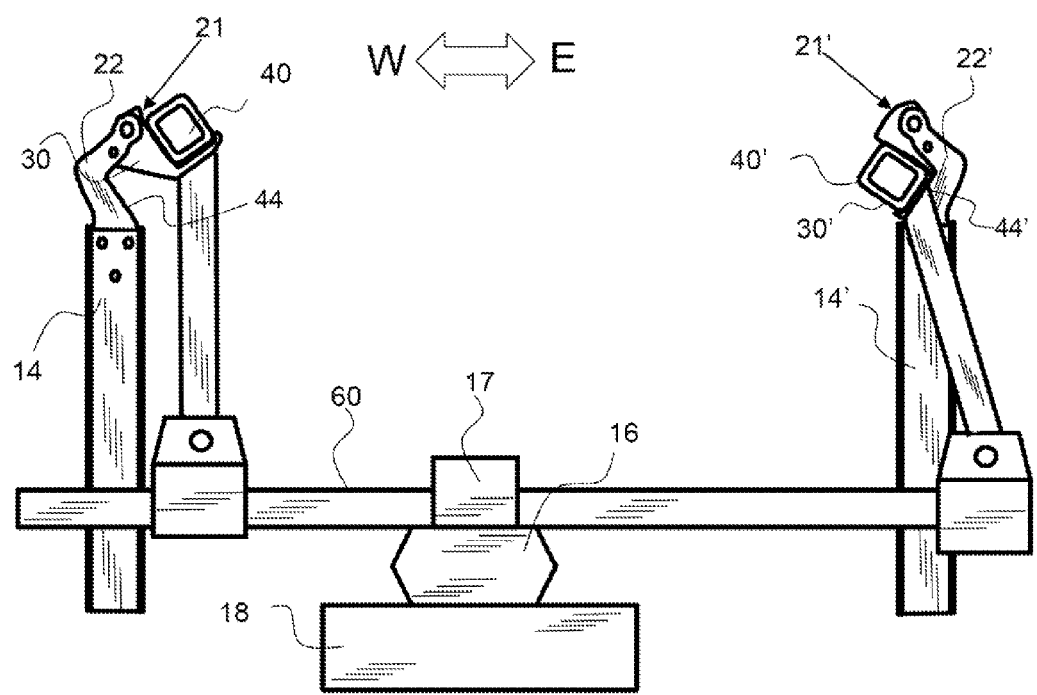

FIG. 14 shows a side view of two exemplary riser assemblies configured on opposing sides of a drive device having torque tubes attached thereon.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Certain exemplary embodiments of the present invention are described herein and illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

As shown in FIG. 1, an exemplary riser assembly 21 comprising a riser support 22 and a tube support 30. The tube support is coupled to the riser support and is configured to rotate about the riser bearing 26, as indicated by the arced arrow. A fastener 27 attaches the tube support to the riser support. The tube support has a center of mass 36 as indicated by the star. The center of mass is to one side of the riser bearing or the rotational axis of the tube support 29. The rotational axis of the tube support extends through the riser bearing, in a preferred embodiment. The tube support is shown in a "fall-to-flat" orientation whereby the weight of the tube support causes the tube support to rotate naturally into the flat orientation. The tube support comprises an extension 32 configured to support the weight and retain a torque tube. A plurality of openings 25 are configured in the tube support and the riser support for attachment of fasteners. The riser support 22 has a first side 23 and a second side 24. A lockout pin 28 is configured to retain the tube support in a given rotational axis. A plurality of lockout pin locations may be provided, whereby the tube support can be retained in a plurality of positions. The riser support has a generally planar geometry.

As shown in FIG. 2, an exemplary riser assembly 21 is attached to a structural support 14. Bolt type fasteners 27 have been inserted through the openings 25 to secure the riser support to the structural support. It is to be noted that a riser support may be configured as an integral part of a structural support, however attachment, as shown, provides for more precise alignment and positioning of the riser supports. The tube support 30 comprises a safety stop 42 that is a raised portion, or vertical extension, at the terminal end of the tube support extension 32 and configured to prevent a torque tube (not shown) from sliding off the tube support when placed thereon.

As shown in FIG. 3, two exemplary riser assemblies 21, 21' are configured on opposing sides of a drive device 16. The tube supports 30, 30' both face the drive device 16, with the tube support extensions 32, 32' extending toward the drive device. A torque tube is configured to be retained by each of the riser assemblies in a proximate position to the drive device. A link bar 60 is shown be coupled to the drive device 16 by a drive coupling 17. Any suitable type of drive device may be used to move the link bar including, but not limited to, an electric motor, a servo motor, a pneumatic drive and the like. The drive device is shown be positioned on a drive support 18 which may be secure and stationary to enable the drive device to force the index bar in one direction or another. The riser assemblies may positioned on an east side and a west side of a central drive device 16, as shown.

As shown in FIG. 4, an exemplary torque tube 40 is retained by a tube support 30 by a tube fastener 34. The torque tube is configured to rest on the tube support extension 32. The tube support and torque tube retained thereon are configured to rotate about the riser bearing 26. The tube fasteners is inserted through openings in the tube support, as shown in FIG. 1, and retained. The tube stop 42 may enable a torque tube 40 to be configured across a plurality of tube supports 30 and thereafter retained by tube fasteners 34.

As shown in FIG. 5, an exemplary torque tube 40 extends across and is retained by a plurality of risers 20-20'''. A riser and riser assembly are used interchangeably herein.

As shown in FIG. 6, an exemplary torque tube 40 extends across and is retained by a pair of risers 20, 20' and a pair of solar modules 12, 12' are coupled thereto. Module supports 13 are attached to the tube support for retaining solar modules. Any number of solar modules may be retained on a torque tube. The torque tube is configured to rotate about the riser bearing and therefore position the solar modules in an angular position of optimum solar exposure.

As shown in FIG. 7, an exemplary riser assembly 21 is retaining a torque tube 40. The horizontal axis of the riser bearing, or rotational axis of the tube support 29, is indicated by the double arrow horizontal line. The center of mass of the tube support 36 is shown being below the horizontal axis o riser bearing. The majority of the torque tube 40 is configured below the horizontal axis in the "fall-to-flat" orientation, as shown. The weight of the torque tube will cause the tube support to rotate into a fall-to-flat orientation when no external force is exerted thereon. Therefore, solar modules attached to the torque tube will also automatically fall-to-flat, and may be configured in a substantially horizontal position automatically. The riser is configured with a tube stop 44, whereby a torque tube attached to the tube support will hit the tube stop, thereby preventing the tube support from rotating beyond this rotational position.

As shown in FIG. 8, an exemplary riser assembly 21 has a torque tube 40 retained thereon and a lever arm 50 attached to the torque tube. The lever arm is configured to move in such a way as to rotate the tube support 22 about the riser bearing 26. The torque tube end 54 of the lever arm may be affixed to the torque tube in any suitable manner and may be configured to pivot.

As shown in FIG. 9, an exemplary riser assembly 21 has a torque tube 40 retained thereon and a lever arm 50 attached to the torque tube. The lever arm is coupled to a lever link coupler 56 and is configured to rotate about the lever pivot or lever rotational axis 58. The lever rotational axis 58, extending perpendicular through the lever pivot, allows the lever arm 50 to rotate or pivot as the lever link coupler 56 is moved back and forth by the link bar, as indicated by the horizontal double arrowed line. The torque tube end 54 of the lever arm may be affixed to the torque tube in any suitable manner and may be configured to pivot. The center of mass 36 of the tube support 30 and the torque tube 40 attached thereon, is configured to stay to one side of the vertical plane 80 extending through the rotational axis of the tube support. Even with solar modules attached, the tube support will stay to one side of the vertical plane 80 and in the event that the lever arm is released from the lever link coupler, or is not supported and held in a rotational position about the riser bearing, the tube support and torque tube will fall to flat and in no case will rotate over the riser bearing to the opposing side of the vertical plane. The vertical plane 80 extending through the rotational axis of the tube support 29, or through the riser bearing 26, is aligned with the lever rotational axis 58 when the tube support is in a flat orientation, or when the tube support, or tube support extension 32 is aligned with a horizontal plane 84 extending through the rotational axis of the tube support 29. In this configuration, the offset distance, or the vertical offset between the vertical plane 80 and the lever rotational axis 58 is substantially zero.

As shown in FIG. 10, the link bar 60 has moved to the right, thereby moving the lever link coupler 56 and forcing the lever arm 50 into a more vertical position. The tube support 30 has been forced into a rotational orientation, or rotational offset 86 from flat, about the riser bearing 26. The link bar has moved a distance equal to the offset distance 59. A tube support may be configured to rotate any suitable degree about the riser bearing including, but not limited to, about 40 degrees or more, about 45 degrees or more, or no more than about 50 degrees. The tube support may rotate a negative rotational offset, whereby a torque tube 40 attached thereon will hit the riser along the tube stop 44. The positive rotational offset, or rotational offset from the horizontal plane 84, may be configured to be any suitable amount including, but not limited to, about 30 degrees or more, about 40 degrees or more, about 45 degrees or more, or no more than about 50 degrees. In an exemplary embodiment, the center of mass of the torque tube and/or the torque tube with the solar modules attached thereto is configured to rotate through an arc that is on one side of the vertical plane 80 extending through the riser bearing. This keeps weight on the lever arm and helps to reduce oscillation of the solar modules from wind. The weight of the solar modules to one side of the riser bearing, continuously pushes down to dampen any oscillations that occur.

As shown in FIG. 11, two exemplary riser assemblies 21, 21' have a torque tube 40 retained thereon and a lever arm 50 is attached to the torque tube. The link bar end 52 of the lever arm 50 is coupled to a lever link coupler 56 and is configured to pivot about lever pivot 66 or about the lever rotational axis 58. The lever link coupler is configured to attached to a link bar (not shown), and may be slid along the length of a link bar and retained in a desired location. The offset distance 59 of the lever rotational axis to the rotational axis of the tube support is shown. This offset distance may be set to control the amount of rotation of a tube support about the riser bearing.

As shown in FIG. 12, two exemplary riser assemblies 21, 21' are configured on a first side of a central drive device 16, and two exemplary riser assemblies 21", 21'" are configured on a second on a second side of a central drive. A link bar 60 extends between the two lever tube couplers 55, 55'. The link bar is configured to move toward and away from the first and second side as indicated by the double arrow line. When the link bar moves, the link bar end 52 of the lever arms 50 is moved an equal distance which causes the tube support to be rotated about the riser bearing. This rotation also rotates the torque tubes 40, 40' attached to the tube supports and positions solar modules in an angular orientation. Note that both the riser assemblies on the first side and the riser assemblies on the second side both face the central drive device. It may be desirable to set the offset distance of a first lever arm equal to the offset distance of a second lever arm when the tube support is in a fall to flat orientation. The lever arm 50 has a force that is exerted down as indicated by the arrow. This downward force creates a force on the link bar that is in a direction away from the drive device. The lever arm 50' exerts also exerts a downward force that results in a force on the link bar that is in a direction away from the drive device. These two forces are opposing and therefore balance each other when the load, or force exerted by the opposing lever arms are substantially equal. Balancing these forces reduces the load on the central drive device and enables a lower output drive device to move the link bar. A torque tube may be configured with a large number of solar module and this can be a significant weight and load on the lever arm when forced into an angular orientation. Balancing of this weight and force on the link bar allows for a lower power draining control system. The two torque tubes 40, 40' are substantially parallel in orientation, with the length axis of the first torque tube being substantially parallel with the length axis of the second torque tube 40'.

As shown in FIG. 13A, an exemplary solar module array 10 is configured with a link bar 60 in a first position and solar modules 12, 12' in a substantially flat or horizontal orientation. The offset angle 57 of the lever arm is shown and is the angle between a vertical line through the rotational axis of the tube support and the angle of the length axis of the lever arm 50. A link bar coupling 62 is shown coupling two segments of a link bar together. The central drive device is shown between two riser assemblies 21, 21' and may be positioned in any suitable location between the two opposing riser assemblies and not necessarily at a center point between the two.

As shown in FIG. 13B, the exemplary solar module array 10 shown in FIG. 13A has moved to a second position. The large arrow pointing left indicates that the link bar has moved by a link bar offset distance 64. The two lever tube couplers 55, 55' have therefore also moved an equal offset distance 59. This change is offset distance causes the lever arm to rotate the tube support 30 and position the solar modules 12, 12' in an angular position. The lever tube coupler 55 on the left side of the central drive device 16 has been moved away from the central drive device and the lever arm 50 has rotated the tube support down. The lever tube coupler 55' on the right side of central drive device has been moved toward the central drive device and the lever arm 50' has rotated the tube support up. The angular orientation of the solar modules 12 and 12' are substantially equal. Also note that the force exerted by the lever arms through the lever arm couplers on the link bar is in opposing directions.

As shown in FIG. 14, two exemplary riser assemblies 21, 21' configured on opposing sides of a drive device 16 have torque tubes 40, 40' attached thereon. The first riser assembly 21 has the tube support 30 in a rotational offset position that is limited by the torque tube 40' hitting the tube stop 44' on the second riser assembly 21'. Since the two riser assemblies are linked by the link bar, the negative rotational offset limit as determined by the tube stop will prevent an opposing tube support on an opposing riser assembly from rotating too far. This unique linked configuration keeps the system within a safe rotational orientation.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:
1. A solar module riser assembly comprising:
  a. a riser support;
  b. a tube support having a tube support extension extending away from the riser support and configured for supporting a single torque tube,
   wherein said tube support is attached to said riser support about a rotational axis;
     wherein a bearing is the rotational axis of the tube support;

wherein said tube support has a center of mass that is positioned to a side of a vertical plane extending through said rotational axis of the tube support; and whereby said tube support and a solar module coupled thereto will fall-to-flat when not being forced into a rotational position about said rotational axis with the center of mass of the tube support and the torque tube configured to said side of the rotation axis.

2. The solar module riser of claim 1, further comprising a lockout pin, whereby the tube support is prevented from rotating about the bearing when said lockout pin is engaged.

3. The solar module riser of claim 1, wherein the center of mass of the tube support remains on one side of the vertical plane extending through the rotational axis throughout a full range of motion of the tube support.

4. The solar module riser of claim 1, wherein the tube support is configured to rotate no more than about 50 degrees from the fall to flat orientation.

5. The solar module riser of claim 1, comprising a tube stop, configured to prevent a torque tube attached to the tube support from rotating beyond the tube stop.

6. A solar module array comprising:
a. a central drive device configured to drive a link bar from a first side of said central drive device to a second side of said central drive device;
b. a first riser comprising:
  i. a first riser support;
  ii. a first tube support having a tube support extension extending away from the first riser support and configured for supporting a single first torque tube,
wherein said first tube support is attached to said first riser support about a first rotational axis;
wherein said first tube support has a center of mass that is configured to a first side of a vertical plane extending through said first rotational axis of the first tube support; and
whereby said first tube support and a first solar module coupled thereto will fall-to-flat, when not being forced into a rotational position about said first rotational axis, with the center of mass of the first tube support and the first torque tube positioned to said first side,
c. a second riser comprising:
  i. a second riser support;
  ii. a second tube support having a tube support extension extending away from the second riser support and configured for supporting a single second torque tube,
wherein said second tube support is attached to said second riser support about a second rotational axis;
wherein said second tube support has a center of mass that is configured to a second side of a vertical plane extending through said second rotational axis of the second tube support; and
whereby said second tube support and a solar module coupled thereto will fall-to-flat, when not being forced into a rotational position about the second rotational axis, with the center of mass of the second tube support and the second torque tube positioned to said second side,
wherein said first riser is positioned on a first side of said central drive device and wherein said second riser is positioned on a second side of said central drive device, and
wherein said solar module array is configured with both the first and second tube supports proximal to the central drive device or both distal to the central drive device with respect to their respective rotational axis;
whereby said link bar coupled to said central drive device and coupled to said first and second risers is substantially weight balanced.

7. The solar module array of claim 6, wherein said first side is an east side of said central drive device and said second side is a west side of said central drive device.

8. The solar module array of claim 6, comprising a first lever arm coupled between the link bar and the first riser and a second lever arm coupled between said link bar and said second riser.

9. The solar module array of claim 8, wherein the first lever arm is coupled to the first torque tube of the first riser and the second lever arms is coupled to the second torque tube of the second said riser, and whereby said first and second torque tubes are substantially parallel.

10. The solar module array of claim 8, wherein the first and second lever arms are coupled to the link bar at substantially equal offset distances from said first and second risers respectively.

11. The solar module array of claim 8, further comprising at least one solar module attached to each of said tube supports.

12. The solar module array of claim 8, wherein the first and second lever arms are coupled to the link bar by a lever link coupler and whereby the first and second lever arms are configured to pivot about a lever rotational axis.

13. The solar module array of claim 12, wherein the lever rotational axis is aligned with a vertical plane extending through the rotational axis of the bearing when in a fall-to-flat orientation.

14. The solar module array of claim 12, wherein the first and second lever link couplers are configured to be moved along a length of the link bar and secured in a position.

15. The solar module array of claim 6 further comprising:
a. a first solar module positioned on a first side of the central drive device and attached to a first tube support;
b. a second solar module positioned on a second side of said central drive and attached to a second tube support;
c. a first lever arm and a second lever arm coupled between the link bar and said first and second tube supports respectively,
wherein said first and second lever arms are coupled to said link bar at substantially equal offset distances from said first and second risers respectively,
whereby said link bar is coupled to said central drive device and coupled to said first and second tube supports and is substantially weight balanced, and,
whereby said first and second lever arms produce a substantially equal and opposing force on the link bar.

16. The solar module of claim 15, wherein the first and second tube support are configured to rotate no more than 50 degrees on one side of a vertical plane extending through their respective rotational axis.

17. A method of tracking a plurality of solar modules comprising the sets of:
a. providing a solar module array comprising:
  a central drive device configured to drive a link bar from a first side of said central drive device to a second side of said central drive device;
  i. a first riser comprising:
    a first riser support;
    a first tube support having a tube support extension extending away from the first riser support and configured for supporting a single first torque tube,
  wherein said first tube support is attached to said first riser support about a first rotational axis;

wherein said first tube support has a center of mass that is configured to a first side of a vertical plane extending through said first rotational axis of the first tube support; and whereby said first tube support and a first solar module coupled thereto will fall-to-flat, when not being forced into a rotational position about said first rotational axis, with the center of mass of the first tube support and the first torque tube positioned to said first side, a second riser comprising:
   a second riser support;
   a second tube support having a tube support extension extending away from the second riser support and configured for supporting a single second torque tube, wherein said second tube support is attached to said second riser support about a second rotational axis;

wherein said second tube support has a center of mass that is configured to a second side of a vertical plane extending through said second rotational axis of the second tube support; and whereby said second tube support and a second solar module coupled thereto will fall-to-flat, when not being forced into a rotational position about the second rotational axis, with the center of mass of the second tube support and the second torque tube positioned to said second side, wherein said first riser is positioned on a first side of said central drive device and wherein said second riser is positioned on a second side of said central drive device, and wherein said solar module array is configured with both the first and second tube supports proximal to the central drive device or both distal to the central drive device with respect to their respective rotational axis;

whereby said link bar coupled to said central drive device and coupled to said first and second risers is substantially weight balanced;
   a first lever arm coupled between said link bar and said first torque tube;
   a second lever arm coupled between said link bar and said second torque tube;

wherein the first and second lever arms are coupled to the link bar by a first and second lever link coupler, respectively, and whereby the first and second lever arms are configured to pivot about a lever rotational axis, respectively b. moving said link bar by said central drive device,
   thereby moving said first and second lever link couplers an equal offset distance,
   thereby moving said lever arms and rotating the first and second tube supports about their respective rotational axis,
   thereby moving said first and second solar modules into an rotational orientation,
   whereby said first and second solar modules are positioned in substantially equal rotational orientations by said link bar movement.

18. The method of tracking a plurality of solar modules of claim 17, wherein the first and second lever link couplers are configured to be moved along a length of the link bar and be secured in a position.

* * * * *